(12) United States Patent
Fry

(10) Patent No.: US 10,630,298 B2
(45) Date of Patent: Apr. 21, 2020

(54) THERMALLY LOCKED OVEN CONTROLLED CRYSTAL OSCILLATOR

(71) Applicant: Greenray Industries, Inc., Mechanicsburg, PA (US)

(72) Inventor: Steven J. Fry, Carlisle, PA (US)

(73) Assignee: Greenray Industries, Inc., Mechanicsburg, PA (US)

( * ) Notice: Subject to any disclaimer, the term of this patent is extended or adjusted under 35 U.S.C. 154(b) by 0 days.

(21) Appl. No.: 16/101,068

(22) Filed: Aug. 10, 2018

(65) Prior Publication Data

US 2019/0058478 A1 Feb. 21, 2019

Related U.S. Application Data

(60) Provisional application No. 62/546,976, filed on Aug. 17, 2017.

(51) Int. Cl.
| | | |
|---|---|---|
| *H03L 1/02* | (2006.01) | |
| *H03L 7/00* | (2006.01) | |
| *H03L 1/04* | (2006.01) | |
| *H03B 5/04* | (2006.01) | |
| *H03B 5/30* | (2006.01) | |
| *H03B 5/32* | (2006.01) | |

(52) U.S. Cl.
CPC .............. *H03L 1/028* (2013.01); *H03B 5/04* (2013.01); *H03B 5/30* (2013.01); *H03B 5/32* (2013.01); *H03L 1/027* (2013.01); *H03L 1/04* (2013.01); *H03L 7/00* (2013.01)

(58) Field of Classification Search
CPC .... H03B 5/04; H03B 5/30; H03B 5/32; H03L 1/028; H03L 1/027
USPC .................................................. 331/176, 158
See application file for complete search history.

(56) References Cited

U.S. PATENT DOCUMENTS

| | | |
|---|---|---|
| 5,041,800 A | 8/1991 | Long et al. |
| 6,545,550 B1 | 4/2003 | Frerking |
| 2005/0184819 A1* | 8/2005 | Oita ........................ H03B 5/04 331/158 |
| 2014/0297056 A1 | 10/2014 | Akaike et al. |

OTHER PUBLICATIONS

Oita, T., et al., "Dual Mode SS-Cut Crystal Oscillator", 2004 IEEE International Ultrasonics, Ferroelectrics, and Frequency Control Joint 50$^{th}$ Anniversary Conference, pp. 436-442.
International Search Report and Written Opinion dated Oct. 24, 2018 in corresponding PCT Application No. PCT/US2018/046444, 15 pgs.

* cited by examiner

*Primary Examiner* — Arnold M Kinkead
(74) *Attorney, Agent, or Firm* — Knobbe, Martens, Olson & Bear, LLP

(57) ABSTRACT

Systems and processes disclosed herein determine the temperature of a crystal, such as a crystal that may be used in a crystal oscillator, using the reference crystal itself. The system can measure the temperature of the crystal without a temperature sensor. Further, a single oven technique may be used to maintain the temperature of the reference crystal. Thus, in certain embodiments, a more compact crystal oscillator can be generated compared to conventional techniques. Further, by measuring the reference crystal based on signals generated by the reference crystal itself, the system disclosed herein is more accurate than many previous crystal oscillator systems.

20 Claims, 11 Drawing Sheets

| Ta | Data F1 | Data F3 | F1/2 | F3/6 | dF | M= | FbM | N= | F3N |
|---|---|---|---|---|---|---|---|---|---|
| 95 | 6,804,364.03 | 19,996,582.11 | 3402182.0150 | 3332763.685 | 69418.3300 | | 1.0847E+03 | | 1085.649716 |
| 90 | 6,804,466.44 | 19,996,686.08 | 3402233.2200 | 3332781.013 | 69452.2067 | | 1.0852E+03 | | 1085.655536 |
| 85 | 6,804,567.05 | 19,996,767.79 | 3402283.5250 | 3332797.965 | 69485.5600 | | 1.0857E+03 | | 1085.660862 |
| 80 | 6,804,665.99 | 19,996,886.35 | 3402332.9950 | 3332814.392 | 69518.6033 | | 1.0862E+03 | | 1085.666233 |
| 75 | 6,804,763.17 | 19,996,981.05 | 3402381.5850 | 3332830.175 | 69551.4100 | | 1.0867E+03 | | 1085.671375 |
| 70 | 6,804,858.21 | 19,997,071.29 | 3402429.1050 | 3332845.215 | 69583.8900 | | 1.0872E+03 | | 1085.676274 |
| 65 | 6,804,950.99 | 19,997,156.33 | 3402475.4950 | 3332859.388 | 69616.1067 | | 1.0878E+03 | | 1085.680691 |
| 60 | 6,805,040.75 | 19,997,234.63 | 3402520.3750 | 3332872.438 | 69647.9367 | | 1.0883E+03 | | 1085.685142 |
| 55 | 6,805,127.61 | 19,997,305.95 | 3402563.8050 | 3332884.325 | 69679.4800 | | 1.0888E+03 | | 1085.689247 |
| 50 | 6,805,211.74 | 19,997,369.60 | 3402605.8700 | 3332894.933 | 69710.9367 | | 1.0892E+03 | | 1085.693452 |
| 45 | 6,805,293.05 | 19,997,424.53 | 3402646.5250 | 3332904.088 | 69742.4367 | | 1.0897E+03 | | 1085.697816 |
| 40 | 6,805,368.14 | 19,997,468.08 | 3402684.0700 | 3332911.347 | 69772.7233 | | 1.0902E+03 | | 1085.694619 |
| 35 | 6,805,439.43 | 19,997,501.28 | 3402719.7150 | 3332916.88 | 69802.8350 | | 1.0907E+03 | | 1085.694619 |
| 30 | 6,805,506.87 | 19,997,523.20 | 3402753.4350 | 3332920.533 | 69832.9017 | | 1.0911E+03 | | 1085.700809 |
| 25 | 6,805,569.14 | 19,997,501.93 | 3402784.5700 | 3332921.988 | 69862.5817 | | 1.0916E+03 | | 1085.701263 |
| 20 | 6,805,625.79 | 19,997,529.35 | 3402812.8950 | 3332921.558 | 69891.3367 | | 1.0921E+03 | | 1085.701143 |
| 15 | 6,805,677.76 | 19,997,512.22 | 3402838.8800 | 3332918.703 | 69920.1767 | | 1.0925E+03 | | 1085.700213 |
| 10 | 6,805,724.44 | 19,997,481.03 | 3402862.2200 | 3332913.505 | 69948.7150 | | 1.0929E+03 | | 1085.698519 |
| 5 | 6,805,765.44 | 19,997,434.28 | 3402882.7200 | 3332905.713 | 69977.0067 | | 1.0934E+03 | | 1085.695981 |
| 0 | 6,805,800.30 | 19,997,372.05 | 3402900.1500 | 3332895.342 | 70004.8083 | | 1.0938E+03 | | 1085.692603 |
| -5 | 6,805,829.75 | 19,997,291.29 | 3402914.8750 | 3332881.882 | 70032.9933 | | 1.0943E+03 | | 1085.688218 |
| -10 | 6,805,852.09 | 19,997,194.22 | 3402926.0450 | 3332865.703 | 70060.3417 | | 1.0947E+03 | | 1085.682948 |
| -15 | 6,805,867.08 | 19,997,080.72 | 3402933.5400 | 3332846.787 | 70086.7533 | | 1.0951E+03 | | 1085.676789 |
| -20 | 6,805,874.96 | 19,996,948.20 | 3402937.4800 | 3332824.7 | 70112.7800 | | 1.0955E+03 | | 1085.669591 |
| -25 | 6,805,875.62 | 19,996,804.01 | 3402937.8100 | 3332800.608 | 70137.1417 | | 1.0959E+03 | | 1085.661763 |
| -30 | 6,805,864.48 | 19,996,635.08 | 3402932.2400 | 3332772.513 | 70159.7267 | | 1.0962E+03 | | 1085.652591 |
| -35 | 6,805,855.80 | 19,996,442.45 | 3402927.9000 | 3332740.408 | 70187.4917 | | 1.0967E+03 | | 1085.642133 |
| -40 | 6,805,834.48 | 19,996,227.59 | 3402917.2400 | 3332704.598 | 70212.6417 | | 1.0971E+03 | | 1085.630468 |
| -45 | 6,805,808.27 | 19,995,994.90 | 3402904.1350 | 3332664.817 | 70238.3183 | | 1.0975E+03 | | 1085.617835 |
| -50 | 6,805,774.79 | 19,995,747.41 | 3402887.3950 | 3332624.568 | 70262.8267 | | 1.0979E+03 | | 1085.604398 |
| -55 | 6,805,731.57 | 19,995,463.15 | 3402865.7850 | 3332577.192 | 70288.5933 | | 1.0983E+03 | | 1085.589965 |

FIG. 8

| Ta | Data F1 | Data F3 | F1/2 | F3/6 | M# | dF | 16 | FbM | N# | F3N |
|---|---|---|---|---|---|---|---|---|---|---|
| 95 | 6,804,364.03 | 19,996,592.11 | 3402182.0150 | 3332763.665 | | 69418.3300 | | 4.3386E+03 | | 4366.065963 |
| 90 | 6,804,466.44 | 19,996,686.08 | 3402233.2200 | 3332781.013 | | 69452.2067 | | 4.3408E+03 | | 4366.088664 |
| 85 | 6,804,567.05 | 19,996,787.79 | 3402283.5250 | 3332797.965 | | 69485.5600 | | 4.3428E+03 | | 4366.110971 |
| 80 | 6,804,665.99 | 19,996,896.35 | 3402332.9950 | 3332814.392 | | 69518.6033 | | 4.3449E+03 | | 4366.132391 |
| 75 | 6,804,763.17 | 19,996,981.05 | 3402381.5850 | 3332830.175 | | 69551.4100 | | 4.3470E+03 | | 4366.153069 |
| 70 | 6,804,858.21 | 19,997,071.29 | 3402429.1050 | 3332845.215 | | 69583.8900 | | 4.3490E+03 | | 4366.172771 |
| 65 | 6,804,960.99 | 19,997,156.33 | 3402475.4950 | 3332859.388 | | 69616.1067 | | 4.3510E+03 | | 4366.191338 |
| 60 | 6,805,040.75 | 19,997,234.63 | 3402520.3750 | 3332872.438 | | 69647.9367 | | 4.3530E+03 | | 4366.208434 |
| 55 | 6,805,127.61 | 19,997,306.95 | 3402563.8050 | 3332884.325 | | 69679.4800 | | 4.3550E+03 | | 4366.224007 |
| 50 | 6,805,211.74 | 19,997,369.60 | 3402605.8700 | 3332894.933 | | 69710.9367 | | 4.3569E+03 | | 4366.237904 |
| 45 | 6,805,293.05 | 19,997,424.63 | 3402646.5250 | 3332904.088 | | 69742.4367 | | 4.3589E+03 | | 4366.249897 |
| 40 | 6,805,368.14 | 19,997,468.08 | 3402684.0700 | 3332911.347 | | 69772.7233 | | 4.3608E+03 | | 4366.259406 |
| 35 | 6,805,439.43 | 19,997,501.28 | 3402719.7150 | 3332916.88 | | 69802.8350 | | 4.3627E+03 | | 4366.266655 |
| 30 | 6,805,506.87 | 19,997,523.20 | 3402753.4350 | 3332920.533 | | 69832.9017 | | 4.3646E+03 | | 4366.271441 |
| 25 | 6,805,569.14 | 19,997,531.93 | 3402784.5700 | 3332921.988 | | 69862.5817 | | 4.3664E+03 | | 4366.273347 |
| 20 | 6,805,625.79 | 19,997,529.35 | 3402812.8950 | 3332921.558 | | 69891.3367 | | 4.3682E+03 | | 4366.272784 |
| 15 | 6,805,677.76 | 19,997,512.22 | 3402838.8800 | 3332918.703 | | 69920.1767 | | 4.3700E+03 | | 4366.269044 |
| 10 | 6,805,724.44 | 19,997,481.03 | 3402862.2200 | 3332913.505 | | 69948.7150 | | 4.3718E+03 | | 4366.262234 |
| 5 | 6,805,765.44 | 19,997,434.28 | 3402882.7200 | 3332905.713 | | 69977.0067 | | 4.3736E+03 | | 4366.252026 |
| 0 | 6,805,800.30 | 19,997,372.05 | 3402900.1500 | 3332895.342 | | 70004.8083 | | 4.3753E+03 | | 4366.238439 |
| -5 | 6,805,829.75 | 19,997,291.29 | 3402914.8750 | 3332881.882 | | 70032.9933 | | 4.3771E+03 | | 4366.220806 |
| -10 | 6,805,852.09 | 19,997,194.22 | 3402926.0450 | 3332865.703 | | 70060.3417 | | 4.3788E+03 | | 4366.199611 |
| -15 | 6,805,867.08 | 19,997,080.72 | 3402933.5400 | 3332846.787 | | 70086.7533 | | 4.3804E+03 | | 4366.17480 |
| -20 | 6,805,874.96 | 19,996,948.20 | 3402937.4800 | 3332824.7 | | 70112.7800 | | 4.3820E+03 | | 4366.145895 |
| -25 | 6,805,875.62 | 19,996,804.01 | 3402937.8100 | 3332800.660 | | 70137.1417 | | 4.3836E+03 | | 4366.114413 |
| -30 | 6,805,864.48 | 19,996,635.08 | 3402932.2400 | 3332772.513 | | 70159.7267 | | 4.3850E+03 | | 4366.077528 |
| -35 | 6,805,855.80 | 19,996,442.45 | 3402927.9000 | 3332740.408 | | 70187.4917 | | 4.3867E+03 | | 4366.035469 |
| -40 | 6,805,834.49 | 19,996,227.59 | 3402917.2400 | 3332704.598 | | 70212.6417 | | 4.3883E+03 | | 4365.988557 |
| -45 | 6,805,808.27 | 19,995,994.90 | 3402904.1350 | 3332665.817 | | 70238.3183 | | 4.3899E+03 | | 4365.937751 |
| -50 | 6,805,774.79 | 19,995,747.41 | 3402887.3950 | 3332624.569 | | 70262.8267 | | 4.3914E+03 | | 4365.883714 |
| -55 | 6,805,731.57 | 19,995,463.15 | 3402865.7850 | 3332577.192 | | 70288.5933 | | 4.3930E+03 | | 4365.821648 |

FIG. 10

THERMALLY LOCKED OVEN CONTROLLED CRYSTAL OSCILLATOR

INCORPORATION BY REFERENCE TO ANY PRIORITY APPLICATIONS

This application claims the benefit of priority of U.S. Provisional Patent Application No. 62/546,976, filed Aug. 17, 2017, and titled "THERMALLY LOCKED OVEN CONTROLLED CRYSTAL OSCILLATOR," which is hereby incorporated by reference in its entirety for all purposes herein. Any and all applications, if any, for which a foreign or domestic priority claim is identified in the Application Data Sheet of the present application are hereby incorporated by reference in their entireties herein under 37 CFR 1.57.

BACKGROUND

Many digital circuits require a clock or clock signal to operate. Often an oscillator is used to generate the clock signal. These oscillators typically include a crystal that vibrates in response to a voltage to generate the clock signal. Often the crystal is a quartz crystal.

Some applications or systems require that the clock frequency have a relatively high degree of stability compared to that required by most consumer systems. For example, some military applications require a higher degree of frequency stability compared to a computer or smart phone of an average user. For instance, a radar system may require a very stable reference frequency to operate. As another example, some computing networks require a higher degree frequency stability for synchronization purposes compared to certain stand-alone computing systems.

SUMMARY

The systems, methods and devices of this disclosure each have several innovative aspects, no single one of which is solely responsible for all of the desirable attributes disclosed herein. Details of one or more implementations of the subject matter described in this specification are set forth in the accompanying drawings and the description below.

Certain embodiments of the present disclosure relate to a thermally locked crystal oscillator. The thermally locked crystal oscillator can include a reference crystal configured to generate a reference signal in response to an applied voltage; a first oscillator circuit configured to obtain a first signal comprising a third overtone frequency of the reference signal; a second oscillator circuit configured to obtain a second signal comprising a fundamental frequency of the reference signal; a beat frequency generator configured to generate a beat frequency signal for the reference signal based at least in part on the first signal and the second signal; a first divider configured to divide the first signal by a first factor to obtain a first modified signal; and a second divider configured to divide the beat frequency signal by a second factor to obtain a modified beat frequency signal. The first factor and the second factor may differ. The first modified signal and the modified beat frequency signal may comprise the same frequency, or substantially the same frequency, at a specific temperature. Further, the thermally locked crystal oscillator may include a phase detector configured to determine a phase difference between the first modified signal and the modified beat frequency signal; and a heat controller circuit configured to control a heater based at least in part on the phase difference.

In certain embodiments, the thermally locked crystal oscillator includes the heater controlled by the heat controller circuit. The heater may be thermally coupled to the reference crystal. In some implementations, the reference crystal comprises a stress compensated cut crystal resonator.

Further, in some embodiments, the beat frequency generator comprises: a third divider configured to divide the first signal by a third factor to obtain a second modified signal; and a fourth divider configured to divide the second signal by a fourth factor obtain a third modified signal. The third factor and the fourth factor may differ. Moreover, the second modified signal and the third modified signal may comprise the same frequency or substantially the same frequency. The beat frequency generator may further include a mixer configured to mix the second modified signal and the third modified signal to obtain the beat frequency. In addition, the beat frequency generator may further comprise a low pass filter configured to filter the beat frequency to obtain a filtered beat frequency. The mixer may include or be implemented as an exclusive or (XOR) logic gate, or using comparable logic gate circuitry. Additionally, or alternatively, the mixer may include or be implemented using an analog balanced mixer.

Moreover, the oven may comprise a single oven. The oven may be configured to apply heat to the reference crystal. In addition, the heat controller circuit may be further configured to maintain a current setting of the oven when the phase difference does not satisfy a threshold difference. Further, the thermally locked crystal oscillator may include an amplifier configured to amplify the first signal and to provide the amplified first signal to an output of the thermally locked crystal oscillator. In addition, the thermally locked crystal oscillator may include a set of registers configured to store the first factor and the second factor.

Certain embodiments of the present disclosure relate to a method of generating a precision crystal oscillator signal. The method may include generating a reference signal from a reference crystal; obtaining an overtone signal corresponding to a third overtone of the reference signal; obtaining a fundamental signal corresponding to a fundamental frequency of the reference signal; generating a beat frequency signal based at least in part on the fundamental signal and the overtone signal; converting the overtone signal based on a first factor to a modified overtone signal; converting the beat frequency signal based on a second factor to a modified beat frequency signal; determining a phase difference between the modified overtone signal and the modified beat frequency signal; and controlling an oven based at least in part on the phase difference. The oven may be configured to apply heat to the reference crystal. The reference crystal may generate reference signals of different frequencies based at least in part on the temperature of the reference crystal.

In certain embodiments, the method further includes applying a voltage to the reference crystal to obtain the reference signal. In addition, the method may include accessing a register to determine the second factor. The second factor can be determined based at least in part on a profile of the reference crystal. Moreover, the method may include determining the profile of the reference crystal by at least: applying an operating voltage to the reference crystal across a range of temperatures; and measuring characteristics of a signal generated by the reference crystal for each temperature from the range of temperatures.

In some implementations, generating the beat frequency signal may comprise: dividing the overtone signal by a third factor to obtain an adjusted overtone signal; dividing the fundamental signal by a fourth factor to obtain an adjusted fundamental signal; and combining the adjusted overtone signal and the adjusted fundamental signal to obtain an aggregated signal. Further, the method may include filtering the aggregated signal to obtain the beat frequency signal. Moreover, combining the adjusted overtone signal and the adjusted fundamental signal may comprise performing an exclusive or (XOR) operation with respect to the adjusted overtone signal and the adjusted fundamental signal.

In some embodiments, controlling the oven based at least in part on the phase difference comprises maintaining a current setting of the oven when the phase difference does not satisfy a threshold difference. Further, in some embodiments, controlling the oven based at least in part on the phase difference comprises modifying an amount of heat applied to the reference crystal when the phase difference satisfies or exceeds a threshold difference.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

FIG. 8 illustrates a table for an example profile generated for a reference crystal with determined divisors for a temperature setpoint of 85° C.

FIG. 10 illustrates a table for an example profile generated for a reference crystal with determined divisors for a temperature setpoint of 25° C.

DETAILED DESCRIPTION

Figure 1:
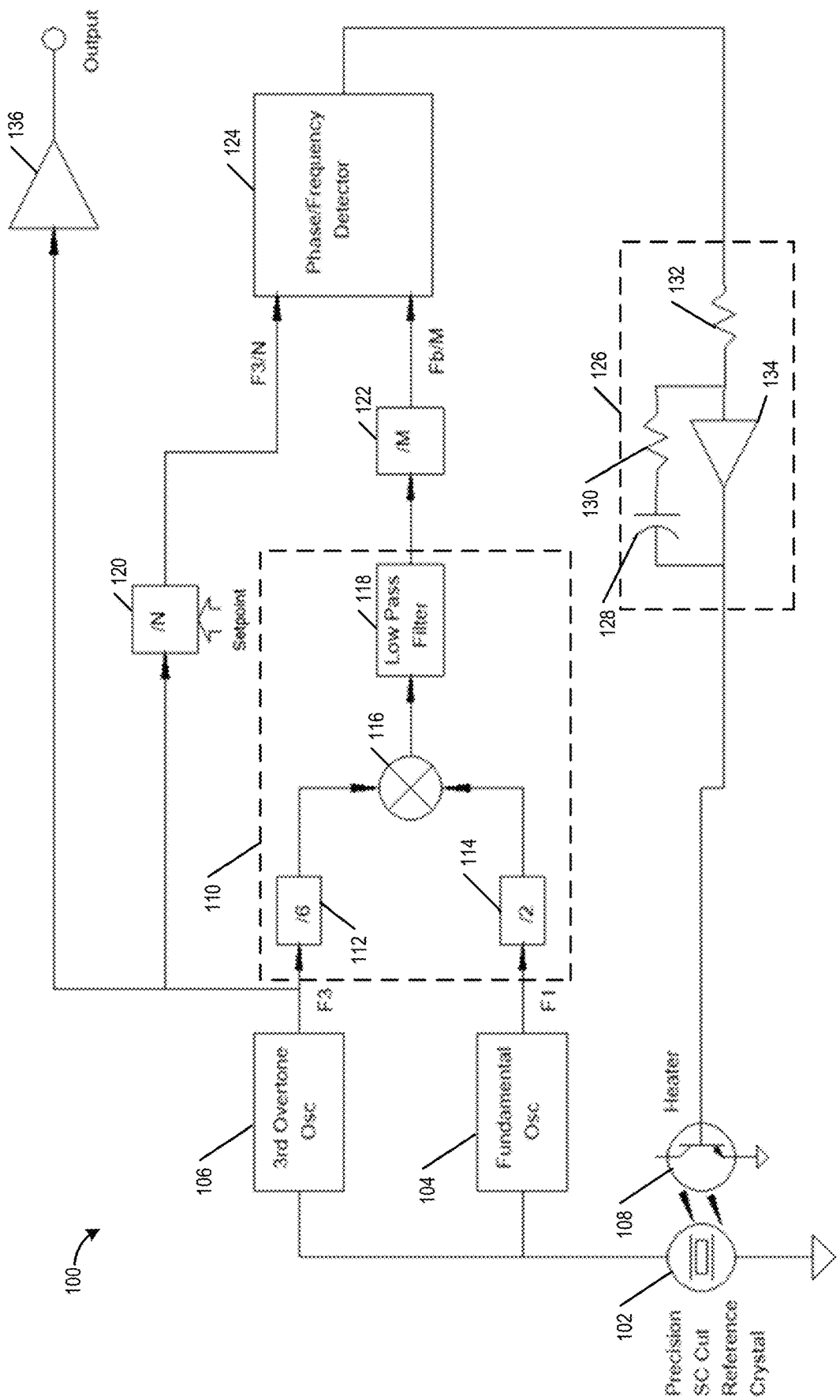
FIG. 1 illustrates a block diagram of an example of an embodiment of a thermally locked crystal oscillator.

Certain applications require higher frequency stability for a clock signal then traditional consumer devices. For example, network synchronization systems and military applications may require frequency stability in the order of 10 ppb (parts per billion) over the course of a year. In other words, for an application with a 10 MHz clock, the drift should be no more than 0.01 Hz or cycles per second in a given year.

To improve the frequency stability of the clock signal, some systems implement a global positioning system (GPS) based system to help generate the clock signal because, in some cases, it is possible to extract a very accurate frequency reference from a GPS signal. Many GPS systems include a cesium-based clock that can produce a more stable signal compared to quartz-based clocks. However, there are occasions when it is not possible to receive a GPS signal. For example, a GPS signal can be jammed or may not penetrate certain materials. Thus, systems that generate a clock signal based on a GPS signal often require a backup oscillator to maintain operation when the GPS signal is lost.

This backup oscillator may be an ovenized crystal oscillator (OCXO). An ovenized crystal oscillator generally includes a heater that heats the reference crystal to an elevated temperature. Further, the oscillator includes a temperature sensor for measuring the temperature of the crystal and adjusting the heater based on the measured temperature so that the crystal is kept at a stable temperature even when outside ambient temperature changes. By maintaining the reference crystal at a particular temperature, the frequency of the signal produced by the crystal in response to a voltage remains stable.

Typically, a very high stability ovenized crystal oscillator uses a double oven technique that puts one ovenized oscillator within another oven to increase the stability of the signal generated by the crystal oscillator. The double oven technique can be complicated and may have problems with frequency stability because of the temperature difference between the ovens.

Some applications use a rubidium-based atomic clock to generate a clock signal. The rubidium cell is more stable than a quartz oscillator. However, the rubidium cell can lose some of its stability when it is placed within a small package. Miniature rubidium oscillators smaller than about 2×2×0.5 inches are typically not as stable as larger rubidium units, which may have package sizes of 3×3×2 inches. Further, an oscillator based on a rubidium cell may have a very narrow operational temperature range that limits its use in many applications and often cannot support temperatures higher than +65° C.

Embodiments disclosed herein include a system and process for determining the temperature of the crystal using the reference crystal itself. The system can measure the temperature of the crystal without a temperature sensor. Further, a single oven technique may be used to maintain the temperature of the reference crystal. Thus, in certain embodiments, a more compact crystal oscillator can be generated compared to conventional techniques. Further, in certain embodiments, by measuring the reference crystal based on signals generated by the reference crystal itself, the system disclosed herein is more accurate than many previous crystal oscillator systems.

In certain embodiments disclosed herein, the system can compare an overtone signal generated by the reference crystal with a different frequency, such as another overtone or the fundamental frequency of the crystal. Both frequencies may be made to oscillate simultaneously by using a pair of specially tuned oscillator circuits. These frequencies can be mixed together and compared to generate a beat frequency from the reference crystal itself. Based on a result of the comparison, the system disclosed herein can determine whether a heat source applied to the reference crystal should be adjusted. By maintaining the reference crystal at a desired temperature, it is possible to maintain the stability of the frequency produced by the reference crystal. As the system herein maintains the reference crystal at a particular temperature automatically controlled by the reference crystal itself, the system may be referred to as a thermally locked crystal oscillator, or a thermally locked OCXO (TLXO).

Example Thermally Locked Crystal Oscillator

FIG. 1 illustrates a block diagram of an example of an embodiment of a thermally locked crystal oscillator 100. The thermally locked crystal oscillator (TLXO) 100 includes a reference crystal 102. This reference crystal 102 is configured to generate a signal in response to an applied voltage. Further, the reference crystal 102 may be a precision stress compensated (SC) cut crystal resonator. Advantageously, in certain embodiments, and SC cut reference crystal may provide higher stability than other types of crystal cuts. Further, the SC cut reference crystal is generally preferred because it has an improved Q factor compared to other crystal cuts. However, the present disclosure is not limited to an SC cut reference crystal and other cuts may be used, such as in a AT cut reference crystal, a BT cut, an XY cut, a GT cut, or an IT cut.

During operation, when a voltage is applied to the reference crystal 102, signals are generated by the oscillator circuits 104 and 106. The oscillator circuit 104 is configured to oscillate on the fundamental frequency of the reference crystal 102. Thus, the oscillator circuit 104 may isolate the fundamental frequency from the overtones of the reference crystal 102 providing a signal comprising the fundamental frequency to a divider 114 of a beat frequency generator 110.

The oscillator circuit 106 may be configured to oscillate on a particular overtone, which may differ from the fundamental frequency, of the reference crystal 102. For example, in the embodiment illustrated in FIG. 1, the oscillator circuit 106 may be configured to oscillate on the third overtone of the reference crystal 102. Thus, the oscillator circuit 106 may isolate the third overtone from other frequencies generated by an application of a voltage to the reference crystal 102. The oscillator circuit 106 may provide a signal comprised of the third overtone frequency to a divider 112 of the beat frequency generator 110. Further, the third overtone signal may be provided to a divider 120 and the beat frequency generated by the beat frequency generator 110 may be provided to a divider 122. The dividers 120 and 122 may convert the third overtone signal and the beat frequency, respectively, to a common frequency signal.

In addition, the third overtone signal output by the filter 106 may be provided to an amplifier 136. The amplifier 136 may amplify the third overtone signal or increase the power of the third overtone signal. This amplified third overtone signal may be output by the TLXO 100 for use as a clock signal in a subsequent circuit connected to the output of the TLXO 100. In some cases, the amplified third overtone signal is provided to a circuit that generates a digital clock based on the amplified third overtone signal. In other cases, the output of the TLXO 100 may be provided to a divider or another phase/frequency detector circuit that is included in a phase-lock loop. However, the circuit that receives the output of the TLXO 100 circuit should be considered non-limiting of the present disclosure.

Although this disclosure primarily describes that the oscillator circuit 106 is used to activate the third overtone, the present disclosure is not limited as such. In some embodiments, other overtones or harmonics may be isolated for use with the systems described herein.

The beat frequency generator 110 may include a number of components used to generate a beat frequency from the fundamental frequency signal and the third overtone frequency signal derived from the signal generated by the reference crystal 102. The frequency of the third overtone is roughly three times the fundamental (typically about 2.97× the fundamental). Thus, after dividing the third overtone by three and mixing with the fundamental frequency, a relatively low frequency beat note may be produced. It should be understood that other dividers or multipliers may be used to facilitate generating the beat frequency or beat note. For example, dividing the third overtone by six and the fundamental frequency by two, or multiplying the fundamental frequency by three without modifying the third overtone may generate a common value for the frequency pair. The beat frequency generator 110 may include a divider 114 that divides the fundamental frequency signal by two and a divider 112 that divides the third overtone frequency signal by six. It should be understood that other divisors are possible in the context of the present disclosure. For example, the divider 112 may divide the third overtone frequency by three and the divider 114 may divide the fundamental frequency by one. In some cases, the divisors may depend on the particular overtone frequency that is isolated by the filter 106. For example, if the filter 106 is configured to generate the fifth overtone instead of the third overtone, the divider 112 may be configured to divide the fifth overtone by ten and the divider 114 may be configured to divide the fundamental frequency by two. Generally, an odd overtone is selected because, due to the physics of the quartz crystal, only the odd overtones are produced Moreover, while it is possible to use other overtones, typically the third overtone is the easiest to process since it produces the strongest signal enabling the use of simpler and more compact circuitry compared to using other overtones.

Further, the beat frequency generator 110 may include a mixer or combiner 116 that combines the output of the divider 112 and the output of the divider 114. In some cases, the signals output by the dividers 112 and 114 are combined using superposition. In other cases, the signals output by the dividers 112 and 114 are combined using one or more logic gates. The combined signal output by the mixer 116 can be filtered by a low pass filter 118. In some cases, the filter 118 may be optional or omitted. The output of the mixer 116 after the low pass filter 118 may be referred to as the beat frequency of the reference crystal 102.

The TLXO 100 may include circuitry for converting the beat frequency and the third overtone frequency of the signal produced by the reference crystal 102 to a common frequency. The circuitry may include a pair of additional dividers 120 and 122. The divider 120 may divide the third overtone frequency by a value N in the divider 122 may divide the beat frequency by a value M. The values N and M may be determined by profiling the reference crystal 102 during a manufacturing process. Profiling the reference crystal 102 may include measuring one or more signals produced by the reference crystal 102 in response to a set of different temperatures. The N and M values are then selected such that the result of dividing the third overtone frequency, or other desired overtone signal, by the divider N and the result of dividing the beat frequency by the divider M are at the same frequency when the reference crystal 102 is at a particular temperature. For example, suppose it is desired that the reference crystal 102 is stabile when operating at +85° C. In such a case, the N and M values may be selected such that when the reference crystal 102 is operating at +85° C. and is receiving a voltage that causes a 10 MHz signal to be produced, the third overtone divided by N and the beat frequency divided by M will produce the same frequency.

Typically, once the dividers N and M are determined for a particular reference crystal, the values N and M are not modified. However, in some embodiments, such as during a recalibration process, updated N and M values may be determined. For instance, one or both of the dividers may be adjusted to change the operating setpoint temperature of the reference crystal 102. Moreover, the N and M values may differ for two different reference crystals.

The TLXO 100 may further include a phase or frequency detector 124. The phase or frequency detector 124 may include circuitry for determining a phase difference or frequency difference between a signal resulting from the third overtone divided by the divider N and a signal resulting from the beat frequency divided by the divider M. In certain embodiments, the phase or frequency detector 124 determines whether a frequency is off or does not match an expected frequency based at least in part on the detection of a phase difference between two signals. Further, in some embodiments, the phase or frequency detector 124 determines that two signals have different frequencies by determining that a phase difference exists between the two signals.

A signal proportional to the determined phase or frequency difference may be provided to a heat controller 126. In cases where the phase or frequency difference is zero, or is less than a threshold difference, the heat controller 126 maintains the operation of the heater 108 at its current setting. However, in cases where the phase or frequency difference is nonzero, or is greater than a threshold difference, the heat controller 126 can adjust the heater 108 to increase or decrease the temperature applied to the reference crystal 102. By adjusting the heat applied by the heater 108 to the reference crystal 102, the frequency of the signal produced by the reference crystal 102 may be modified. The heater 108 may comprise an oven, which can encapsulate the reference crystal 102. The heater 108 may include a power transistor with a controlled current that is used to generate the heat. Other types of heaters may be used. For example, the heater may be a resistive heater.

The heat controller 126 may include a number of elements including an RC circuit comprising a resistor 130 and a capacitor 128. Further, the heat controller 126 may include a resistor 132 and an amplifier 134. It should be understood that the heat controller 126 as one example of a heat controller that can be use with the present disclosure. However, other heat controller's may be used within the context of the present disclosure. The heat controller 126 may be configured as a proportional controller supplying a continuously varying analog signal to the heater 108. Other alternative configurations are possible. For example, the heat controller 126 may include digital controllers which can switch the heater 108 on and off with a varying duty cycle using Pulse Width Modulation (PWM).

In some embodiments, the heater 108 is thermally coupled to the reference crystal 102. Advantageously, in certain embodiments, thermally coupling the heater 108 to the reference crystal 102 enables the temperature of the reference crystal 102 to respond quickly to desired temperature changes determined by the heat controller 126. The heat controller 126 may thermally close a temperature determination loop and lock the temperature of the reference crystal 102 to a predetermined setpoint as determined by various frequency modes of the reference crystal 102 itself.

Example Thermal Lock Circuit

Figure 2:
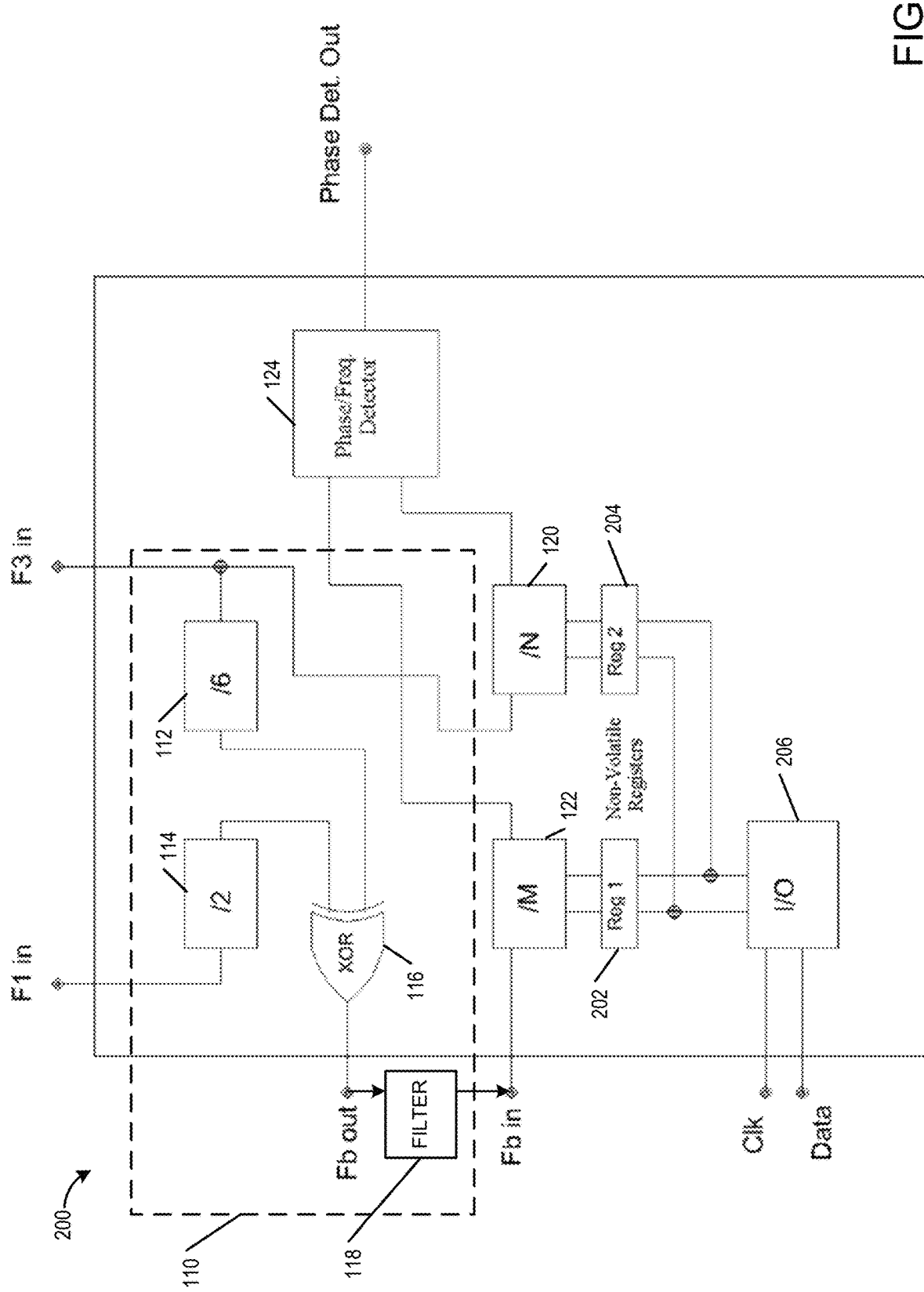
FIG. 2 illustrates a block diagram of an example of a programmable logic device that integrates certain functions of a thermal lock circuit.

FIG. 2 illustrates a block diagram of an example of an embodiment of an integrated circuit including elements of the thermal lock circuit 200. The thermal lock circuit 200 may include a number of the components previously described with respect to the TLXO 100 and can be integrated with a reference crystal, and associated circuitry, to create a TLXO. In some embodiments, the thermal lock circuit 200 may be implemented using a field-programmable gate array (FPGA). However, the present disclosure is not limited as such and other technology may be used to implement the thermal lock circuit 200, such as an application-specific integrated circuit (ASIC) or discrete components.

As illustrated in FIG. 2, the beat frequency generator 110 may be implemented partially within the thermal lock circuit 200 and partially external to the thermal lock circuit 200. For example, the filter 118 may be external to the thermal lock circuit 200. In some embodiments, the unfiltered beat frequency may be output by the thermal lock circuit 200. The outputted beat frequency may be provided to a filter 118, which can filter noise and undesired frequencies from the beat frequency. As previously described, the filter 118 may be a low pass filter. However, the disclosure is not limited as such and in some embodiments, a notch or bandpass filter may be used.

Further, as previously described, the mixer 116 may be implemented using digital logic, such as an exclusive- or (XOR) gate as illustrated in FIG. 2. The XOR gate can be used to mix two square wave signals output by the dividers 112 and 114. However, the present disclosure is not limited to using a mixer comprising an XOR gate and other mixers or combiners are possible. For example, the mixer 116 may be implemented using analog mixing circuitry that can perform superposition using a balanced mixer.

In addition, the thermal lock circuit 200 may include memory for storing the divisors to be used by the dividers 120 and 122. For example, the register 202 may include the divisor for the divider 122 and the register 204 may include the divisor for the divider 120. The registers 202 and 204 may comprise non-volatile registers or non-volatile memory. As mentioned above, the value stored in the registers 202 in 204 may represent the divisors to be used by the dividers 120 and 122. For instance, when the divider 120 receives the third overtone signal, it can use the value stored in the register 204 to determine the divisor to use when dividing the third overtone signal. Similarly, when the divider 122 receives the beat frequency signal, it can use the value stored in the register 202 to determine the divisor to use when dividing the beat frequency signal.

As previously described, different reference crystals may generate signals of different frequencies at particular temperatures. Accordingly, in certain embodiments, the divisors utilized by the dividers 120 and 122 may differ for different reference crystals. In certain embodiments, a particular divisor to use for a particular reference crystal may be determined during a profiling process. This can occur during manufacture of the TLXO 100. Once the appropriate divisors are determined for the reference crystal, the values may be clocked into the registers 202 and 204 using an input/output (I/O) interface 206. In some embodiments, a profile for a particular reference crystal is provided to the I/O interface 206, which can store the profile in a nonvolatile memory. The processor can determine divisors for the dividers 120 and 122 based on the profile of the reference crystal and can store the determined divisors in the registers 202 in 204.

Beat Frequency Vs Third Overtone

Figure 3:
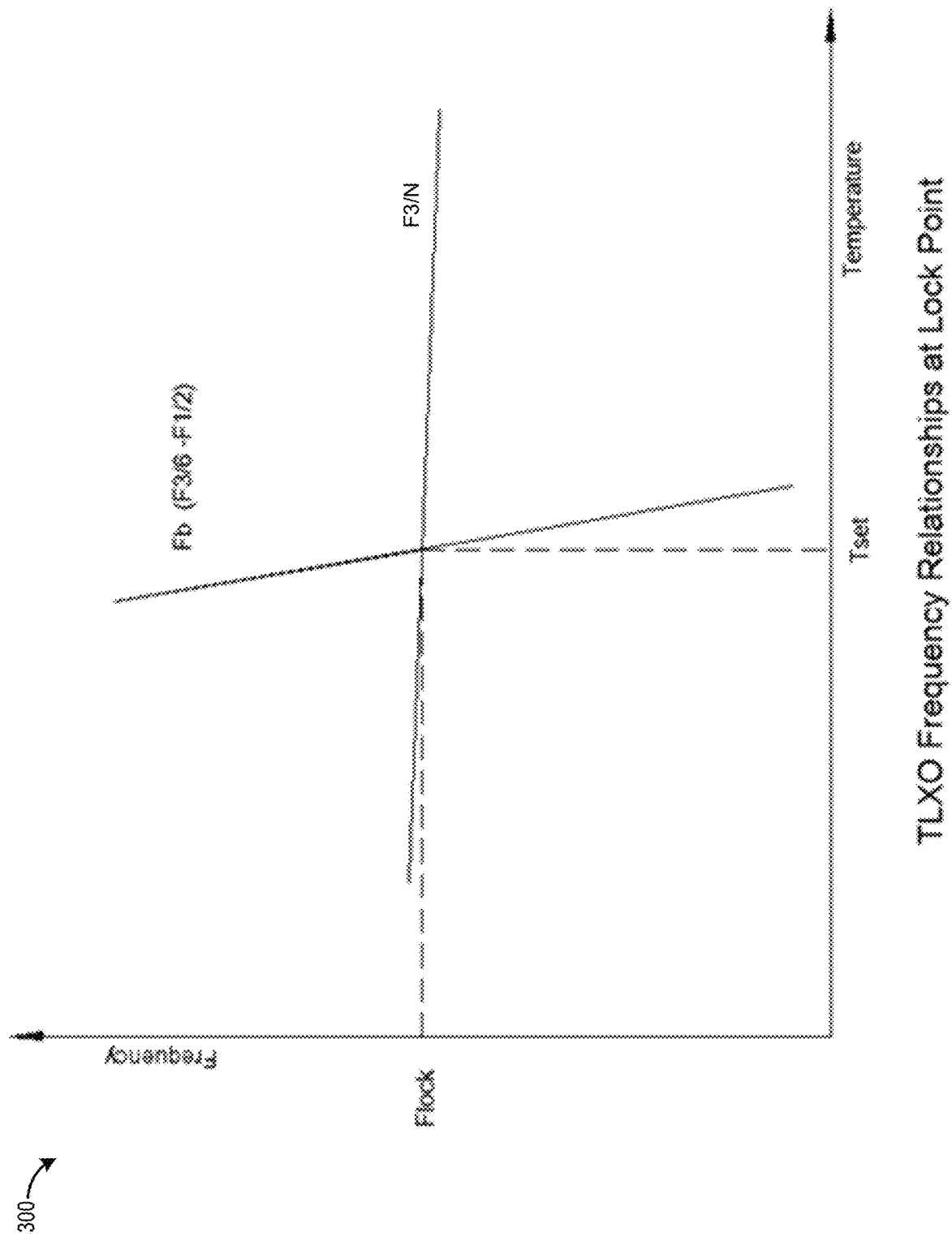
FIG. 3 presents a graph of the relationship between the selected frequencies of a thermally locked oven controlled crystal oscillator after processing to achieve a common frequency.

FIG. 3 presents a graph 300 of the relationship between the selected frequencies for a thermally locked oven controlled crystal oscillator. As previously described, to maintain the stability of the reference crystal it is desirable that the beat frequency signal and the third overtone are set at the same frequency or phase. Thus, the TLXO 100 determines when there is a discrepancy between the beat frequency and the third overtone signal generated by the reference crystal. The temperature of the reference crystal is adjusted or maintained such that the beat frequency and the third overtone continue to intersect. This relationship can be visualized with the graph in FIG. 3, which illustrates the intersection point between the beat frequency and the third overtone divided by N for particular reference crystal. The point at which the beat frequency and the third overtone divided by N intersect identifies the desired temperature value for the reference crystal to maintain the stability of the signal output by the reference crystal.

Example Phase Frequency Detector

Figure 4:
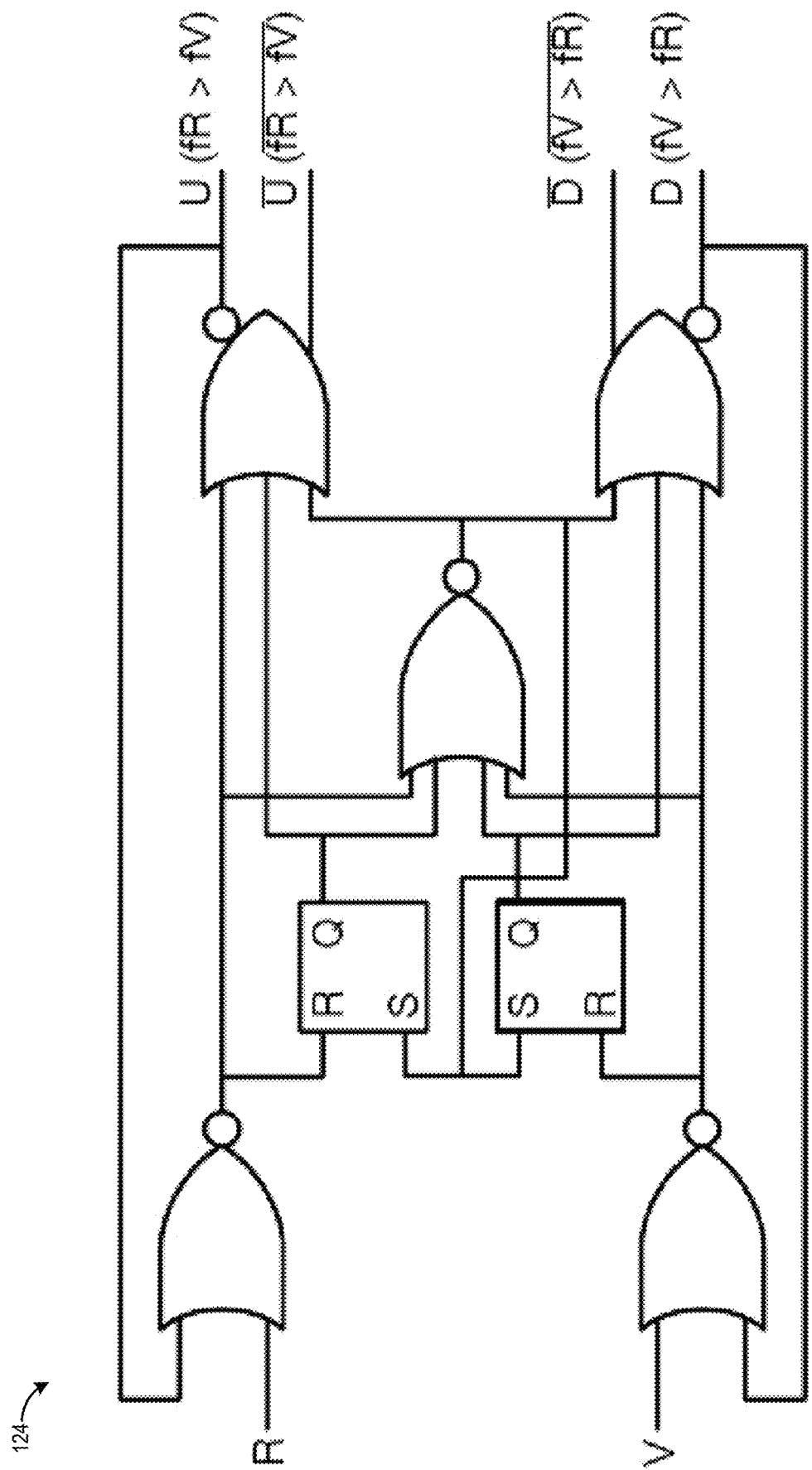
FIG. 4 illustrates an example of an embodiment of a phase frequency detector.

FIG. 4 illustrates an example of an embodiment of a phase frequency detector 124. The logic circuit depicted in FIG. 4 is one non-limiting example of the phase frequency detector 124 that may be used with the embodiments described herein. As illustrated with the example of FIG. 4, the phase frequency detector 124 may include a number of nor gates and a pair of RS flip-flops. Continuing the examples illustrated in FIGS. 1 and 2, R may represent the third overtone signal divided by N and V may represent the beat frequency divided by M.

The internal logic in the phase frequency detector compares the signals presented to the inputs R and V and provides an output indicating the current relationship. If the frequency present at input R is greater than that at input V, the output U will be asserted. Conversely, if the frequency present at input V is greater than that at input R, output D will be asserted. Outputs/U and/D are complementary to U and D and may or may not be used depending on the external circuitry. Additional external components (not shown on the diagram) can convert the U and D outputs to an analog signal which can be used to adjust the temperature of the reference crystal to maintain the common intersection between the third overtone divided by N and beat note frequencies as shown in FIG. 3.

Example Thermal Lock Process

Figure 5:
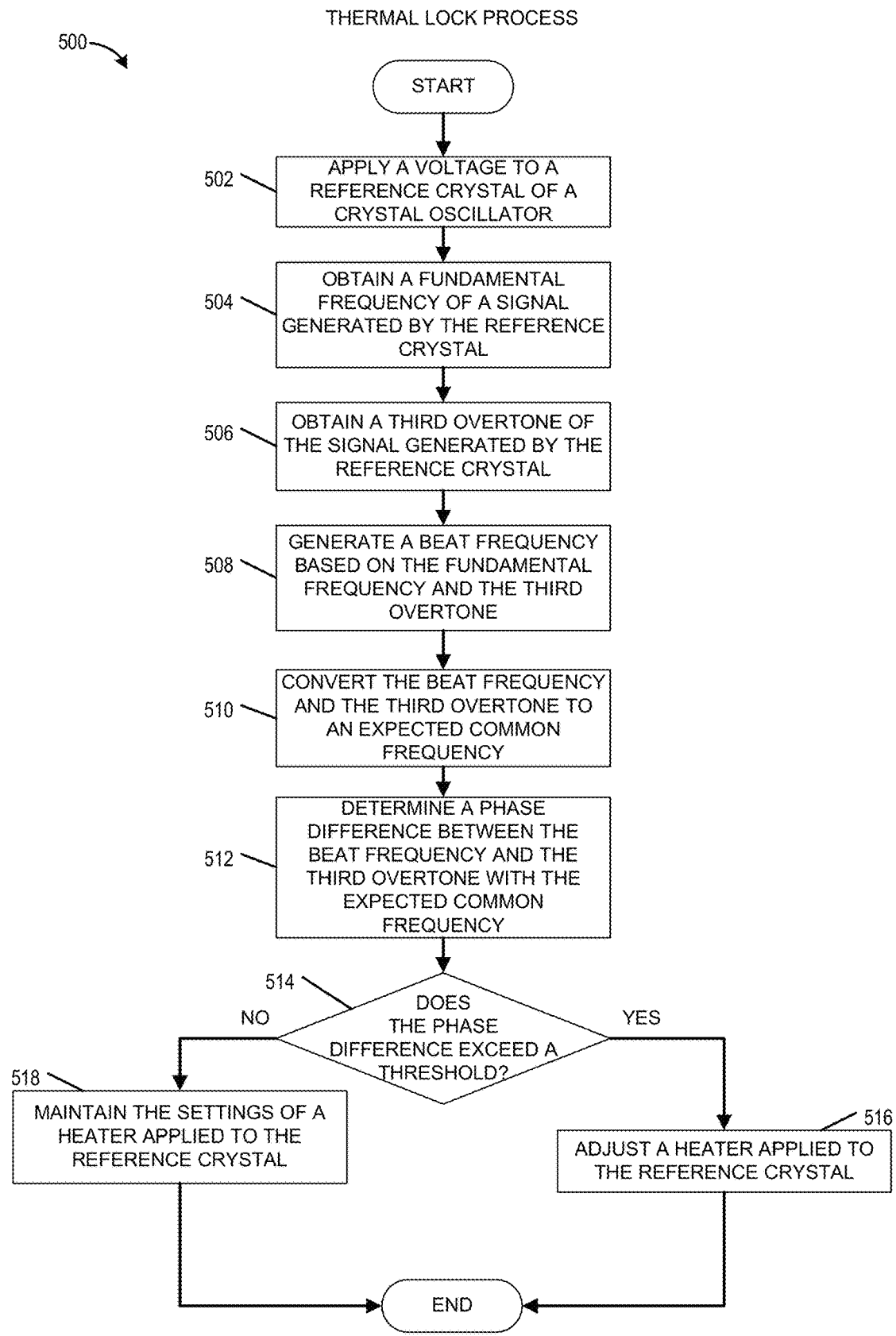
FIG. 5 presents a flowchart of an example embodiment of a thermal lock process.

FIG. 5 presents a flowchart of an example embodiment of a thermal lock process 500. The process 500 can be implemented by any system that can use a thermal process to maintain the stability of a crystal. The process 500, in whole or in part, can be implemented by one or more circuit elements of a thermally locked crystal oscillator 100 as described above. In some embodiments, the process 500 may be performed by a hardware controller that interacts with one or more of the elements of the TLXO 100. Although any number of systems, in whole or in part, can implement the process 500, to simplify discussion, the process 500 will be described with respect to particular systems. Further, it should be understood that the process 500 may be performed continuously or intermittently over time. For example, the process 500 may be continuously performed while the TLXO 100 is powered or while a voltage is applied to the reference crystal 102. Alternatively, the process 500 may be performed every second, every 15 seconds, every minute, or any other time duration. In some cases, the process 500 is performed each time a greater than threshold change is detected with respect to a signal output by the TLXO 100.

The process 500 begins at block 502 where, for example, a voltage is applied to a crystal oscillator 100. In response to the voltage being applied to the reference crystal 102, a signal is generated. The particular signal generated may depend on the temperature of the reference crystal 102 when the voltage is applied. Typically, the generated signal will comprise a plurality of frequencies. This plurality of frequencies often includes a fundamental frequency and a number of signal overtones. The frequencies generated by the reference crystal 102 may be determined during a profiling process of the reference crystal 102. The profiling process may include measuring the frequency signals produced by the reference crystal in response to different temperatures. Moreover, the profiling process may include determining a particular temperature that will produce a signal with a desired frequency when a supply voltage is applied to the reference crystal 102 at the particular temperature. As different reference crystals may have different properties, the temperature applied to the reference crystal to obtain a desired frequency may vary for different crystals.

At block 504, a fundamental frequency of a signal generated by the reference crystal 102 is obtained. This fundamental frequency may be obtained in response to the application of the voltage at block 502. The obtained fundamental frequency may vary based on the particular temperature of the reference crystal 102. In some embodiments, the fundamental frequency is obtained by using an oscillator circuit 104 to isolate a signal having the fundamental frequency from the signal generated at the block 502 in response to the application of the voltage to the reference crystal 102. In other embodiments, the oscillator 104 is replaced or supplemented with a measuring circuit or device that is capable of measuring or determining the fundamental frequency of the signal generated at the block 502.

At block 506, a third overtone of the signal generated by the reference crystal 102 is obtained. This third overtone may be obtained from the same signal generated in response to the application of the voltage at block 502. In certain embodiments, obtaining the third overtone and the fundamental frequency from the same signal is possible because both the third overtone and the fundamental frequency may be obtained from respective oscillator circuits 104 and 106 that are tuned to cause the reference crystal 102 to oscillate on both frequencies simultaneously. In some embodiments, the third overtone is obtained by using a tuned oscillator 106 to isolate a signal having the frequency of the third overtone from the fundamental frequency signal generated at the block 502. In other embodiments, the oscillator 106 is replaced or supplemented with a measuring circuit or device that is capable of measuring or determining the third overtone of the signal generated at the block 502.

The beat frequency generator 110 generates a beat frequency at block 508 based on the fundamental frequency determined at the block 504 and the third overtone determined at the block 506. The beat frequency may be determined using a number of different systems or processes. One non-limiting example embodiment of determining the beat frequency is described in more detail below with respect to FIG. 6.

At block 510, the TLXO 100 divides the beat frequency signal and divides the third overtone signal by predetermined divisors so that the resultant signals are of the same frequency or substantially the same frequency. The divisors may be determined during a profiling process for the reference crystal 102. However after the conversion process, changes in the temperature of the reference crystal 102 may cause the frequencies of the two signals to change. The particular common frequency desired for the intersection of the beat frequency and the third overtone as shown in FIG. 3 may depend on the desired set temperature, Tset, for each particular reference crystal. One non-limiting example embodiment of converting the beat frequency signal and the third overtone signal to a common frequency is described in more detail below with respect to FIG. 7.

At block 512, a phase/frequency detector circuit 124 is used to determine a phase or frequency difference between the modified beat frequency signal and the modified third overtone signal generated at the block 510. In some embodiments, the block 512 involves determining a frequency difference in addition to or instead of determining the phase difference. Typically, a phase difference between the modified beat frequency signal and the modified third overtone signal indicates that there is a frequency difference. In certain embodiments, because the signals were converted to approximately a common frequency, or a frequency that is expected to be close to the same frequency, at the block 510, a difference in phase between the two signals indicates that the frequency of the two signals might not match. Further, if the frequencies do not match between the modified beat frequency signal and the modified third overtone signal, it is likely that the temperature of the reference crystal 102 differs from the desired set temperature, Tset. For example, the ambient temperature may cause the temperature of the reference crystal 102 to differ from the desired set temperature.

During profiling of the reference crystal 102, values for the beat frequency and the third overtone are determined for a particular reference crystal 102 and temperature. Further, the divisors are determined during the profiling process for converting the third overtone frequency and the beat frequency to a common frequency. Thus, in cases where a discrepancy is determined between the converted beat frequency and the converted third overtone, it can be determined that the reference crystal is no longer producing the expected signal for the particular desired set temperature. Thus, it can be further determined that the reference crystal 102 is no longer being maintained at the desired temperature to produce the desired signal. Based on the difference in phase and/or frequency between the converted beat frequency and the converted third overtone signal, the difference between the temperature of the reference crystal 102 and the desired temperature of the reference crystal 102 can be determined. This difference may be used to modify the settings of the heater 108 to obtain a desired temperature for the reference crystal 102.

At decision block 514, it is determined whether the phase difference determined at block 512 exceeds a threshold. In some embodiments, the threshold is zero and any phase difference may cause the heater 108 to be adjusted. In other embodiments, the threshold is selected based on unallowable or maximum error rate for the reference crystal 102.

If it is determined at the decision block 514 that the phase difference exceeds the threshold, the heat controller 126 adjusts the heater 108 at block 516 causing an amount of heat applied to the reference crystal 102 to be modified. The heat controller 126 may adjust the temperature by generating a correction signal that is supplied to the heater 108. The heater 108 may adjust the heat applied to the reference crystal 102 based at least in part on the correction signal. It should be understood that adjusting the temperature may include lowering or raising the heat.

On the other hand, if it is determined at the decision block 514 that the phase difference does not exceed the threshold, the heat controller 126 maintains the settings of the heater 108 at block 518. By maintaining the settings of the heater 108, the amount of heat applied to the reference crystal 102 is left unchanged. Further, by adjusting or maintaining the temperature applied to the reference crystal 102 based at least in part on the determination of the phase difference, a drift of the frequency of a signal produced in response to an unwanted voltage change can be reduced or eliminated. In some embodiments, the drift can be reduced or eliminated even when a change in ambient temperature exists.

The process 500, and much of this application, is described as comparing two signals, the beat frequency and the third overtone. However, in some embodiments, more than two signals may be compared. For example, the beat frequency signal, the third overtone signal, and the fifth overtone signal may be compared using a modified version of the process 500.

Example Beat Frequency Generation Process

Figure 6:
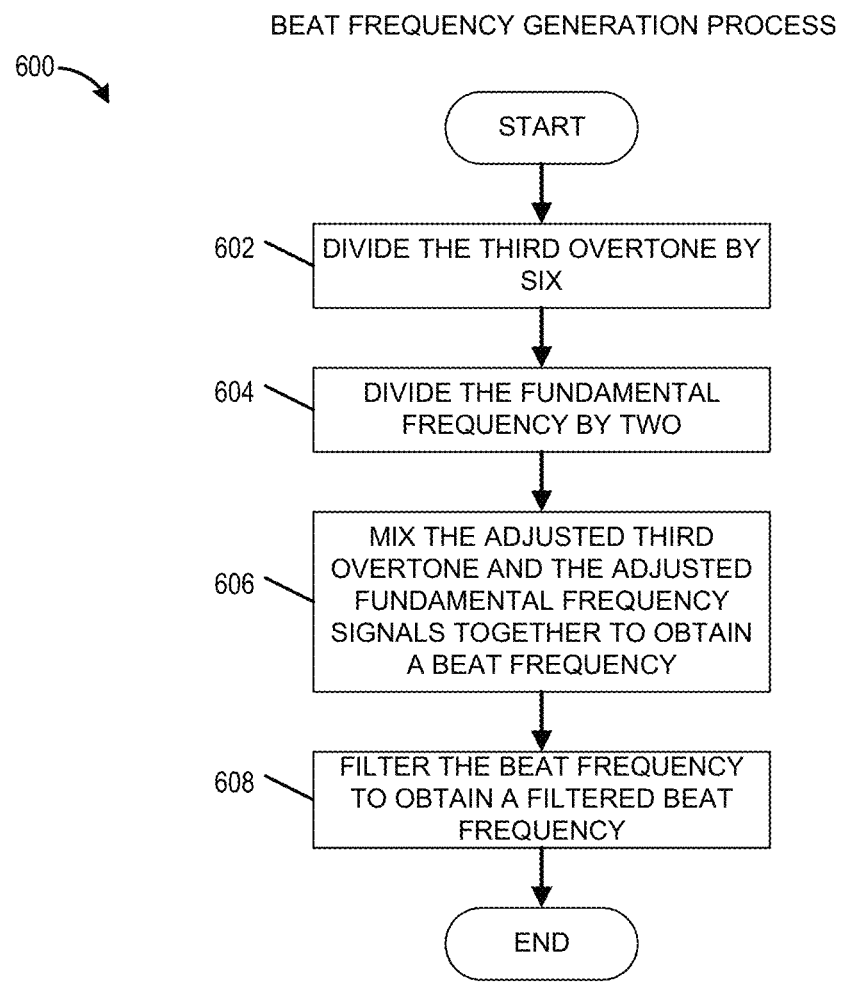
FIG. 6 presents a flowchart of an example embodiment of a beat frequency generation process.

FIG. 6 presents a flowchart of an example embodiment of a beat frequency generation process. The process 600 can be implemented by any system that can generate a beat frequency for a crystal or a crystal oscillator. The process 600, in whole or in part, can be implemented by one or more circuit elements of a thermally locked crystal oscillator 100 as described above. In some embodiments, the process 600 may be performed by a hardware controller that interacts with one or more of the elements of the TLXO 100. Although any number of systems, in whole or in part, can implement the process 600, to simplify discussion, the process 600 will be described with respect to particular systems. Further, it should be understood that the process 600 may be performed continuously or intermittently over time. For example, the process 600 may be continuously performed while the TLXO 100 is powered or while a voltage is applied to the reference crystal 102. Alternatively, the process 600 may be performed every second, every 15 seconds, every minute, or any other time duration. In some cases, the process 600 is performed each time the process 500 is performed. In some embodiments, the process 600 is performed as at least part of the process associated with the block 508 of FIG. 5. In certain embodiments when the process 600 is performed intermittently, the output voltage from the heater control circuit 126 may be latched or held at its last valid setting during the interval when the process 600 is not active or being performed so that the heater temperature, and therefore the frequency of the reference crystal 102, remain substantially constant and un-perturbed.

The process 600 begins at block 602 where, for example, the third overtone signal is divided by six by the divider 112. Although in this particular example the block 602 involves dividing the third overtone signal by six, it is possible to use other dividers. For example, in some embodiments, the third overtone could be divided by 12 when the fundamental frequency is divided by four. Further, in some embodiments, it is possible that the signal provided by the oscillator 106 is a different overtone, and in some such cases the divider 112 may use a different divisor for dividing the signal provided by the oscillator 106.

At block 604, the divider 114 divides the fundamental frequency signal by two. As with the block 602, in some embodiments, a different divisor may be utilized by the divider 114. In certain embodiments, the values of the divisors utilized by the dividers 112 and 114 are selected such that the resultant signals share or are substantially close to a common frequency. In other certain embodiments the fundamental frequency may be multiplied by three in order to arrive at a quasi-common frequency which is close to the third overtone frequency. The beat frequency may therefore be generated without requiring any dividers.

At block 606, the mixer 116 mixes the adjusted third overtones signal output by the divider 112 and the adjusted fundamental frequency signal output by the divider 114 together to obtain a beat frequency. In some cases, the mixer 116 may use superposition to mix the adjusted third overtone signal and the adjusted fundamental frequency signal. In other cases, the mixer 116 may use an XOR process or other digital logic to combine the signals.

At block 608, the filter 118 filters the beat frequency to obtain a filtered beat note. In some embodiments, the block 608 may involve filtering the beat frequency to obtain a low frequency beat note and rejecting the high frequency products of the mixing process of the block 606. In some embodiments, the signal output by the mixer 116 is filtered by the filter 118 to obtain the beat frequency. Further, in some embodiments, the block 608 may be optional or omitted.

In some implementations, the beat frequency may be produced by mixing the fundamental frequency divided by two as in block 604 together with the third overtone frequency divided by six as in block 602. The mixing function at block 606 may produce a new frequency as the sum of the two input frequencies and another new frequency as the difference of the two input frequencies. Subsequently, passing the composite signal through a low pass filter 118 removes the sum component leaving the low frequency beat note. Since the frequency versus temperature slope of the fundamental frequency differs from the frequency versus temperature slope of the third overtone, the frequency of the resultant beat note in block 608 is directly proportional to the instantaneous temperature of the reference crystal.

Example Common Frequency Conversion Process

Figure 7:
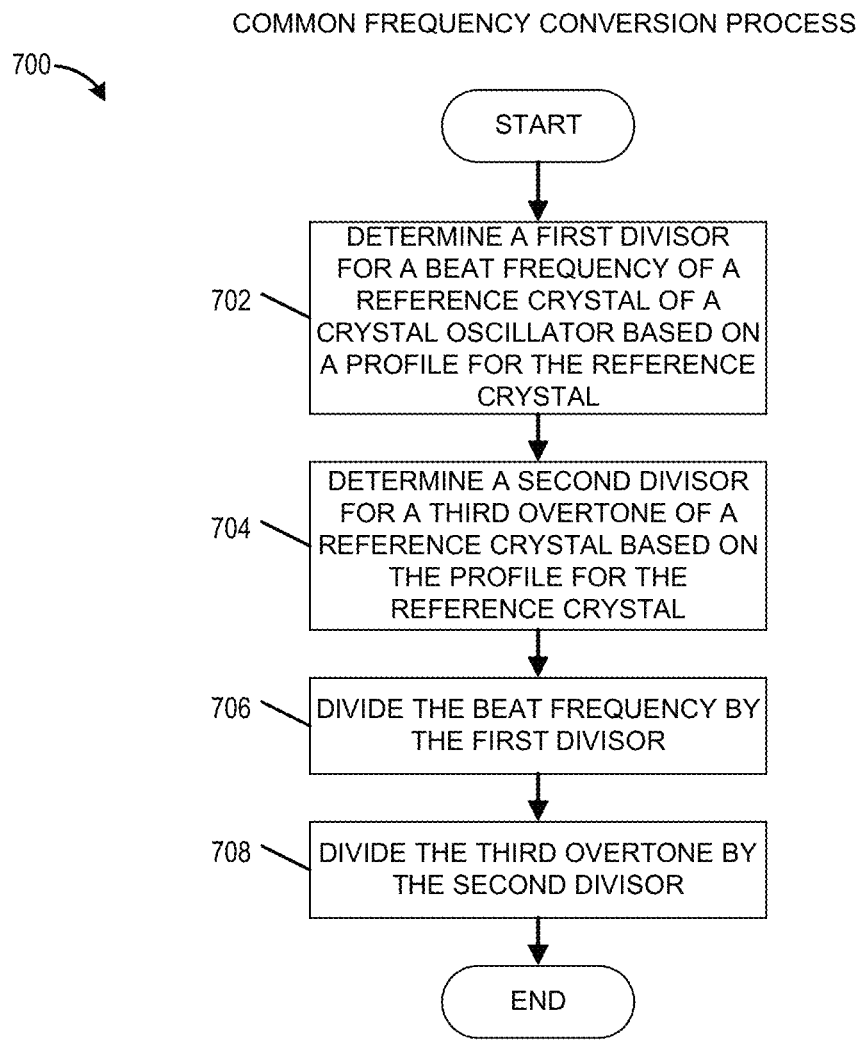
FIG. 7 presents a flowchart of an example embodiment of a common frequency conversion process.

FIG. 7 presents a flowchart of an example embodiment of a common frequency conversion process 700. The process 700 can be implemented by any system that can convert two signals to a common frequency. The process 700, in whole or in part, can be implemented by one or more circuit elements of a thermally locked crystal oscillator 100 as described above. In some embodiments, the process 700 may be performed by a hardware controller that interacts with one or more of the elements of the TLXO 100. Although any number of systems, in whole or in part, can implement the process 700, to simplify discussion, the process 700 will be described with respect to particular systems. Further, it should be understood that the process 700 may be performed continuously over time or may be performed intermittently. For example, the process 700 may be continuously performed while the TLXO 100 is powered or while a voltage is applied to the reference crystal 102. Alternatively, the process 600 may be performed every second, every 15 seconds, every minute, or any other time duration. In some such cases, the output from the heater control circuit 126 may be latched and held substantially constant during the intervals between performances of the process 700. Latching the heater control circuit 126 may help ensure that the temperature of the reference crystal 102 remains stable during the intermittent time period so that the frequency of the reference crystal 102 is not perturbed. In some cases, the process 700 is performed each time the process 500 is performed. In some embodiments, the process 700 is performed as at least part of the process associated with the block 510 of FIG. 5.

The process 700 begins at block 702 where, for example, a first divisor for a beat frequency of a reference crystal 102 of a crystal oscillator is determined based at least in part on a profile for the reference crystal. The first divisor may be determined or obtained by evaluating the results of a temperature profile process. In some embodiments, the divisor is stored in register 202. Thus, the divisor may be obtained by accessing the register 202. In some cases, the first divisor is determined based at least in part on a profile process for profiling the reference crystal 102. The profiling process may include determining the beat frequency for the reference crystal 102 when various temperatures are applied to the reference crystal. A desired common frequency for the beat frequency and the third overtone may be determined based at least in part on the profile for the reference crystal 102. Once a desired common frequency is selected, the first divisor can be determined for converting the beat frequency obtained at a particular voltage and temperature value to the desired common frequency. In certain embodiments, after the first divisor is determined, it may be stored at the register 202 using the I/O interface 206.

At block 704, a second divisor for a third overtone of the reference crystal 102 can be determined based at least in part on the profile for the reference crystal. The second divisor may be determined or obtained by accessing a register 204. In some embodiments, the second divisor is determined for a different overtone or harmonic of the reference crystal 102. Further, the block 704 can include one or more of the embodiments previously described with respect to the block 702. The first and second divisors are generally selected such that an expected frequency of the beat frequency signal matches an expected frequency of the third overtone signal when the signals are divided by the respective divisors. Thus, an expected common frequency may be generated. However, as described above, in cases where the temperature of the reference crystal 102 does not satisfy or match an expected or desired condition, the frequency of the beat frequency signal and the frequency of the third overtone signal may not match after the conversion process.

At block 706, the divider 122 divides the beat frequency signal by the first divisor. The divider 120 divides the third overtone signal by the second divisor at block 708. As described above, if the temperature of the reference crystal matches an expected condition, the frequency of the beat frequency signal and the frequency of the third overtone signal will match after the processes associated with the blocks 706 and 708 are performed. Similarly, the phases of the two signals should match. If it is determined that the phases do not match, then the frequencies of the beat frequency signal and the third overtone signal will not match. Advantageously, in certain embodiments, by determining whether the signals share a matching phase or frequency, it is possible to determine the temperature of the reference crystal 102 from the signals of the reference crystal 102. Thus, the temperature of the reference crystal 102 can be determined without a temperature measurement circuit. Further, a single-oven can be used to adjust the temperature of the crystal without need for a double-oven.

Example Reference Crystal Profiles

FIGS. 8-11 present examples profiles and simulation graphs created for a real-world reference crystal configured to operate at temperature setpoints of 85° C. or 25° C. FIG. 8 illustrates a table for an example profile generated for a reference crystal with determined divisors for a temperature setpoint of 85° C. As indicated by column 802, the temperature profile for the reference crystal was obtained in increments of 5° C. in a range of −55° C. to 95° C. Columns 804 and 806 present the fundamental and third overtone frequencies, respectively, measured for the reference crystal. Columns 808, 810, and 812 illustrate the result of determination of the beat note or frequency for the reference crystal. Column 808 is the fundamental frequency divided by 2, column 810 is the third overtone frequency divided by 6, and column 812 is the beat note after mixing the results of columns 808 and 810 together.

Divisors M and N are determined for a desired temperature setpoint for the particular profiled reference crystal. In the example of FIG. 8, the desired temperature setpoint selected is 85° C. Cell 816 includes the value of the divisor M (64) determined for the desired setpoint temperature and cell 818 includes the value of the divisor N (18419) determined for the desired setpoint temperature. The selected divisors M and N are chosen such that the beat frequency or beat note divided by M (as listed in column 814) and the third overtone divided by N (as listed in column 822) will produce the same, or a substantially similar, value (as illustrated by cells 820 and 824 that contain substantially the same value) when the reference crystal is operating at the desired setpoint temperature. Thus, if the frequency detector 124 determines that the beat frequency divided by M and the third overtone divided by N do not produce the same value, it can be determined that the reference crystal is no longer at the desired setpoint temperature of 85° C. Consequently, it can be determined that the reference crystal is not generating the desired signal frequency.

Figure 9:
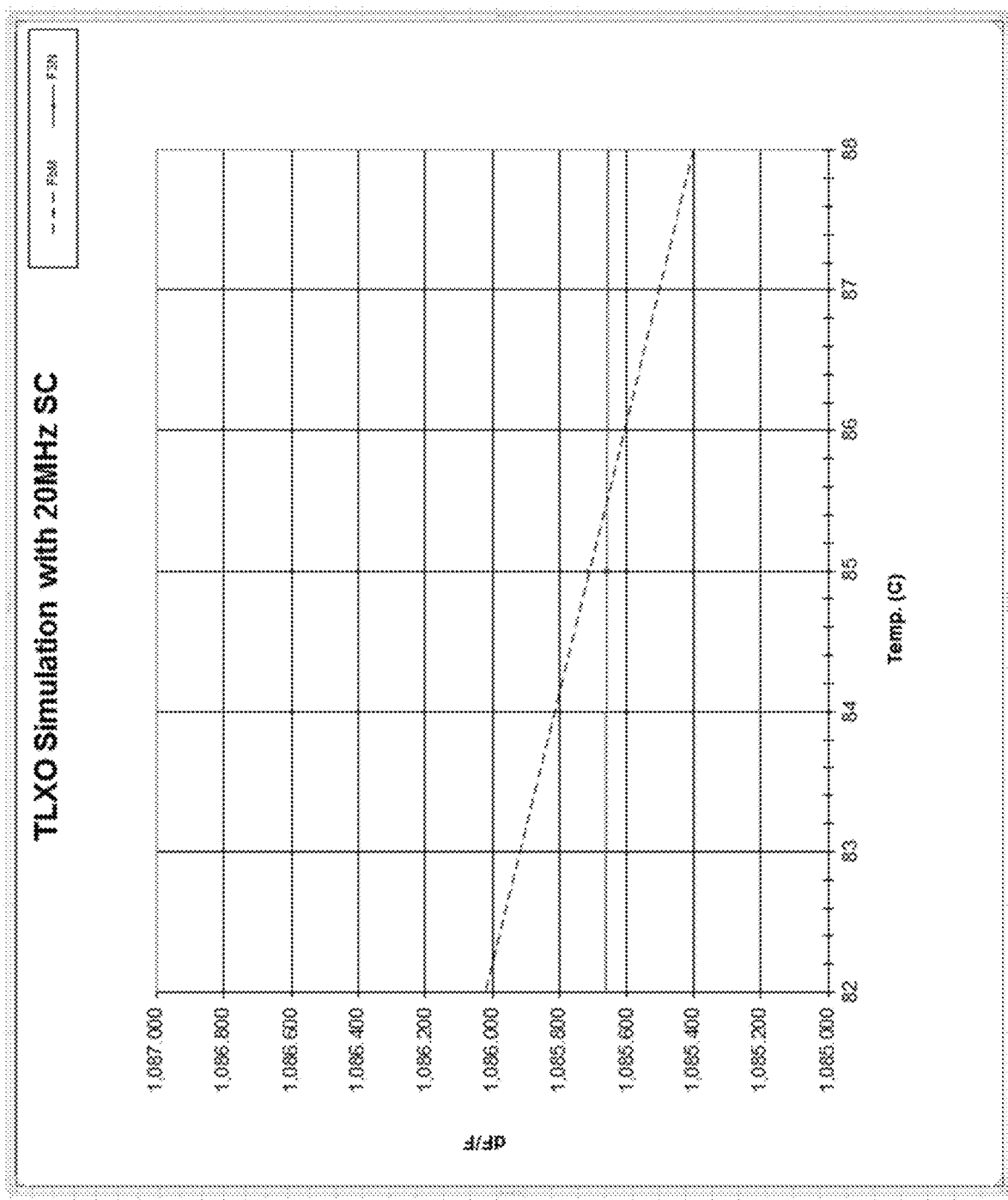
FIG. 9 illustrates a graph simulation comparing the third overtone signal and the beat note signal normalized to a common frequency for the reference crystal profile of FIG. 8 for a temperature setpoint of 85° C.

FIG. 9 illustrates a graph simulation comparing the third overtone signal and the beat note signal normalized to a common frequency for the reference crystal profile of FIG. 8 for a temperature setpoint of 85° C. The dashed line represents the beat note divided by the divisor M and the solid line represents the third overtone divided by the divisor N. As indicated by the simulation of the reference crystal, the two lines are substantially close at 85° C. and intersect close to 85° C. As the frequency difference between the lines grows, it can be determined that the reference crystal is operating further from the desired temperature setpoint and consequently is not maintaining the desired frequency.

FIG. 10 illustrates a table for an example profile generated for a reference crystal with determined divisors for a temperature setpoint of 25° C. The reference crystal profiled in the example of FIG. 10 is the same crystal profiled in FIG. 8. Thus, the frequency values over the evaluated temperatures remain the same as indicated by the re-use of reference numerals. However, because the desired setpoint temperature differs, the selected divisors for M and N have changed. As indicated by the cell 1002, the divisor M is determined to be 16 and as indicated by the cell 1004, the divisor N is determined to be 4580. These divisors M and N are selected to obtain a common frequency at the desired setpoint temperature for the beat note signal and the third overtone when divided by the divisors M and N, respectively. The updated values for the beat note signal divided by M is represented in column 1006 across the selected temperature range and the updated values for the third overtone signal divided by N is represented in column 1008 across the selected temperature range. As illustrated by the cells 1010 and 1012, the values for the normalized beat note signal and third overtone signal are substantially the same at the desired setpoint temperature of 25° C. Further, as the desired setpoint temperature in this example has changed from the example illustrated in FIG. 8, the values at 85° C. are no longer the same as illustrated by cells 1014 and 1016.

Figure 11:
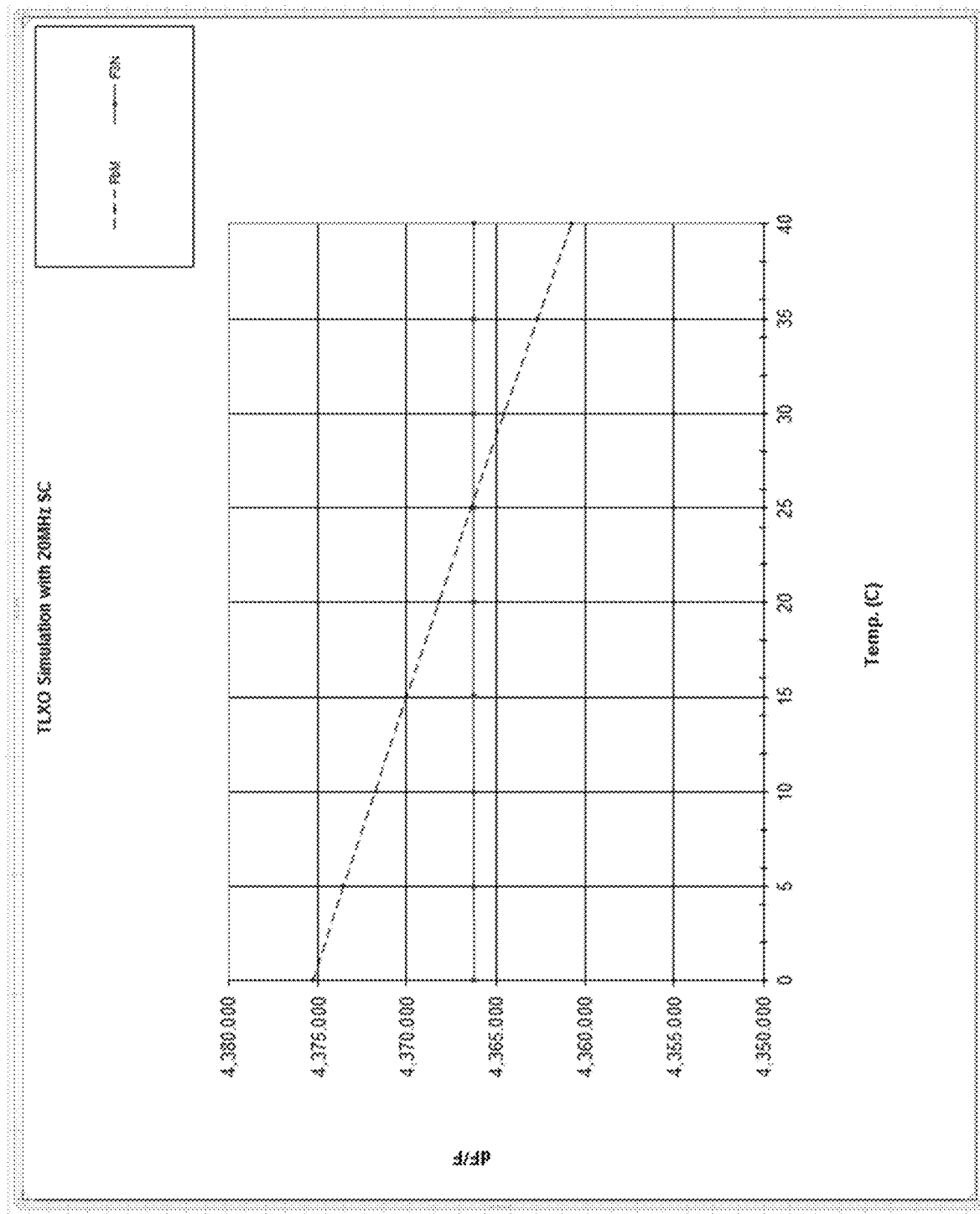
FIG. 11 illustrates a graph simulation comparing the third overtone signal and the beat note signal normalized to a common frequency for the reference crystal profile of FIG. 10 for a temperature setpoint of 25° C.

FIG. 11 illustrates a graph simulation comparing the third overtone signal and the beat note signal normalized to a common frequency for the reference crystal profile of FIG. 10 for a temperature setpoint of 25° C. The dashed line represents the beat note divided by the divisor M and the solid line represents the third overtone divided by the divisor N. As indicated by the simulation of the reference crystal, the two lines intersect at 25° C. As the frequency difference between the lines grows, it can be determined that the reference crystal is operating further from the desired temperature setpoint and consequently is not maintaining the desired frequency.

Terminology

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the above-described embodiments, the elements of which are to be understood as being among other acceptable examples. All such modifications and variations are intended to be included herein within the scope of this disclosure.

What is claimed is:

1. A thermally locked crystal oscillator comprising:
    a reference crystal configured to generate a reference signal in response to an applied voltage;
    a first oscillator circuit configured to obtain a first signal comprising a third overtone frequency of the reference signal;
    a second oscillator circuit configured to obtain a second signal comprising a fundamental frequency of the reference signal;
    a beat frequency generator configured to generate a beat frequency signal for the reference signal based at least in part on the first signal and the second signal;
    a first divider configured to divide the first signal by a first factor to obtain a first modified signal;
    a second divider configured to divide the beat frequency signal by a second factor to obtain a modified beat frequency signal, wherein the first factor and the second factor differ, and the first modified signal and the modified beat frequency signal comprise the same frequency at a specific temperature;
    a phase detector configured to determine a phase difference between the first modified signal and the modified beat frequency signal; and
    a heat controller circuit configured to control a heater based at least in part on the phase difference, wherein the beat frequency generator comprises:
        a third divider configured to divide the first signal by a third factor to obtain a second modified signal;
        a fourth divider configured to divide the second signal by a fourth factor obtain a third modified signal, wherein the third factor and the fourth factor differ, and the second modified signal and the third modified signal comprise substantially the same frequency; and
        a mixer configured to mix the second modified signal and the third modified signal to obtain the beat frequency.

2. The thermally locked crystal oscillator of claim 1, further comprising the heater, wherein the heater is thermally coupled to the reference crystal.

3. The thermally locked crystal oscillator of claim 1, wherein the reference crystal comprises a stress compensated cut crystal resonator.

4. The thermally locked crystal oscillator of claim 1, wherein the beat frequency generator further comprises a low pass filter configured to filter the beat frequency to obtain a filtered beat frequency.

5. The thermally locked crystal oscillator of claim 1, wherein the mixer comprises an XOR gate.

6. The thermally locked crystal oscillator of claim 1, wherein the mixer comprises an analog balanced mixer.

7. The thermally locked crystal oscillator of claim 1, wherein the oven comprises a single oven.

8. The thermally locked crystal oscillator of claim 1, wherein the oven is configured to apply heat to the reference crystal.

9. The thermally locked crystal oscillator of claim 1, wherein the heat controller circuit is further configured to maintain a current setting of the oven when the phase difference does not satisfy a threshold difference.

10. The thermally locked crystal oscillator of claim 1, further comprising an amplifier configured to amplify the first signal and to provide the amplified first signal to an output of the thermally locked crystal oscillator.

11. The thermally locked crystal oscillator of claim 1, further comprising a set of registers configured to store the first factor and the second factor.

12. A method of generating a precision crystal oscillator signal, the method comprising:
    generating a reference signal from a reference crystal;
    obtaining an overtone signal corresponding to a third overtone of the reference signal;
    obtaining a fundamental signal corresponding to a fundamental frequency of the reference signal;
    generating a beat frequency signal based at least in part on the fundamental signal and the overtone signal;
    converting the overtone signal based on a first factor to a modified overtone signal;
    converting the beat frequency signal based on a second factor to a modified beat frequency signal;
    determining a phase difference between the modified overtone signal and the modified beat frequency signal; and
    controlling an oven based at least in part on the phase difference, the oven configured to apply heat to the reference crystal, wherein the reference crystal generates reference signals of different frequencies based at least in part on the temperature of the reference crystal, wherein generating the beat frequency signal comprises:

dividing the overtone signal by a third factor to obtain an adjusted overtone signal;

dividing the fundamental signal by a fourth factor to obtain an adjusted fundamental signal; and combining the adjusted overtone signal and the adjusted fundamental signal to obtain an aggregated signal.

13. The method of claim 12, further comprising applying a voltage to the reference crystal to obtain the reference signal.

14. The method of claim 12, further comprising accessing a register to determine the second factor.

15. The method of claim 12, wherein the second factor is determined based at least in part on a profile of the reference crystal.

16. The method of claim 15, further comprising determining the profile of the reference crystal by at least:

applying an operating voltage to the reference crystal across a range of temperatures; and measuring characteristics of a signal generated by the reference crystal for each temperature from the range of temperatures.

17. The method of claim 12, further comprising filtering the aggregated signal to obtain the beat frequency signal.

18. The method of claim 12, wherein combining the adjusted overtone signal and the adjusted fundamental signal comprises performing an exclusive-or operation with respect to the adjusted overtone signal and the adjusted fundamental signal.

19. The method of claim 12, wherein controlling the oven based at least in part on the phase difference comprises maintaining a current setting of the oven when the phase difference does not satisfy a threshold difference.

20. The method of claim 12, wherein controlling the oven based at least in part on the phase difference comprises modifying an amount of heat applied to the reference crystal when the phase difference satisfies or exceeds a threshold difference.

* * * * *